US009509278B2

United States Patent
Caffee et al.

(10) Patent No.: US 9,509,278 B2
(45) Date of Patent: Nov. 29, 2016

(54) ROTATIONAL MEMS RESONATOR FOR OSCILLATOR APPLICATIONS

(71) Applicant: Silicon Laboratories Inc., Austin, TX (US)

(72) Inventors: Aaron J. Caffee, Scappoose, OR (US); Jeffrey L. Sonntag, Austin, TX (US); Brian G. Drost, Corvallis, OR (US); Mehrnaz Motiee, San Francisco, CA (US)

(73) Assignee: Silicon Laboratories Inc., Austin, TX (US)

( * ) Notice: Subject to any disclaimer, the term of this patent is extended or adjusted under 35 U.S.C. 154(b) by 697 days.

(21) Appl. No.: 13/828,066

(22) Filed: Mar. 14, 2013

(65) Prior Publication Data

US 2014/0266509 A1    Sep. 18, 2014

(51) Int. Cl.
*H03H 9/24*    (2006.01)
*H03H 9/02*    (2006.01)
*H03B 5/30*    (2006.01)

(52) U.S. Cl.
CPC .............. *H03H 9/2457* (2013.01); *H03B 5/30* (2013.01); *H03H 9/02259* (2013.01); *H03H 9/02275* (2013.01); *H03H 9/2431* (2013.01); *H03H 2009/02291* (2013.01); *H03H 2009/02346* (2013.01); *H03H 2009/02496* (2013.01)

(58) Field of Classification Search
CPC .. H03B 5/30; H03H 9/02259; H03H 9/2457; H03H 2009/02291; H03H 2009/02496; H03H 9/02275; H03H 9/2431; H03H 2009/02346
USPC .......................................... 333/186; 331/154
See application file for complete search history.

(56) References Cited

U.S. PATENT DOCUMENTS

| | | | |
|---|---|---|---|
| 6,282,958 B1 | 9/2001 | Fell et al. | |
| 6,686,807 B1* | 2/2004 | Giousouf | H03B 5/30 331/116 M |
| 7,040,163 B2 | 5/2006 | Shcheglov et al. | |
| 7,581,443 B2 | 9/2009 | Kubena et al. | |
| 2008/0204153 A1* | 8/2008 | Yoshida | H03B 5/30 331/66 |
| 2010/0314969 A1 | 12/2010 | Gaidarzhy et al. | |
| 2011/0111545 A1 | 5/2011 | El-Gamal | |
| 2013/0002363 A1 | 1/2013 | Motiee et al. | |

OTHER PUBLICATIONS

Kaajakari, Ville, Practical MEMS, Small Gear Publishing, p. 337 and p. 343, 2009, 4 pages.
Rahafrooz, Amir and Pourkamali, Siavash, "Rotational Mode Disk Resonators for High-Q Operation in Liquid," IEEE Sensors Conference, 2010, pp. 1071-1074.

* cited by examiner

*Primary Examiner* — Robert Pascal
*Assistant Examiner* — Jorge Salazar, Jr.
(74) *Attorney, Agent, or Firm* — Abel Law Group, LLP

(57) ABSTRACT

An apparatus includes a microelectromechanical system (MEMS) device. The MEMS device includes a resonator suspended from a substrate, an anchor disposed at a center of the resonator, a plurality of suspended beams radiating between the anchor and the resonator, a plurality of first electrodes disposed about the anchor, and a plurality of second electrodes disposed about the anchor. The plurality of first electrodes and the resonator form a first electrostatic transducer. The plurality of second electrodes and the resonator form a second electrostatic transducer. The first electrostatic transducer and the second electrostatic transducer are configured to sustain rotational vibrations of the resonator at a predetermined frequency about an axis through the center of the resonator and orthogonal to a plane of the substrate in response to a signal on the first electrode.

17 Claims, 4 Drawing Sheets

ROTATIONAL MEMS RESONATOR FOR OSCILLATOR APPLICATIONS

BACKGROUND

Field of the Invention

The invention is related to microelectromechanical systems (MEMS).

Description of the Related Art

In general, microelectromechanical systems (MEMS) are very small mechanical devices. Typical MEMS devices include sensors and actuators, which may be used in various applications, e.g., accelerometers, gyroscopes, and pressure sensors. The mechanical device is typically capable of some form of mechanical motion and is formed at the micro-scale using fabrication techniques similar to those utilized in the microelectronic industry, such as thin film deposition and thin film patterning by photolithography and reactive ion etching (RIE).

Certain MEMS devices include a resonator, which may be used in timing devices. The resonator may have a variety of physical shapes, e.g., beams and plates. Referring to FIG. 1, a conventional MEMS device (e.g., MEMS device 100) includes resonator 105 coupled to substrate 102 via anchor 104. During operation, electrode 110 electrostatically drives resonator 105 and electrode 110 to dynamically deflect, which increases a capacitance of resonator 105 when a voltage differential exists between resonator 105 and electrode 110 by decreasing the gap between resonator 105 and electrode 110. Since electrode 110 and resonator 105 are the same height and in the same plane, resonator 105, when driven, deforms laterally across a distance between electrode 110 and a second electrode 111, remaining in a plane of electrode 110. The plane of electrode 110 is a plane substantially parallel to substrate 102. Electrode 111 detects the resonant frequency of resonator 105 as the capacitance varies between resonator 105 and electrode 111 in response to the deflection driven by electrode 110. MEMS device 100 is commonly referred to as an "in-plane" or "lateral" mode resonator because resonator 105 is driven to resonate in a mode where the resonator 105 moves laterally (in direction 109) and remains in the plane of electrode 110.

For some MEMS applications (e.g., a low-power clock source), a low-power, high-Q (i.e., quality factor) oscillator may be required. However, the low-power, high-Q specifications may be difficult to achieve using the conventional MEMS device of FIG. 1. Accordingly, improved MEMS devices are desired.

SUMMARY OF EMBODIMENTS OF THE INVENTION

In at least one embodiment of the invention, an apparatus includes a microelectromechanical system (MEMS) device. The MEMS device includes a resonator suspended from a substrate, an anchor disposed at a center of the resonator, a plurality of suspended beams radiating between the anchor and the resonator, a plurality of first electrodes disposed about the anchor, and a plurality of second electrodes disposed about the anchor. The plurality of first electrodes and the resonator form a first electrostatic transducer. The plurality of second electrodes and the resonator form a second electrostatic transducer. The first electrostatic transducer and the second electrostatic transducer are configured to sustain rotational vibrations of the resonator at a predetermined frequency about an axis through the center of the resonator and orthogonal to a plane of the substrate in response to a signal on the first electrode. Each electrode of the pluralities of first and second electrodes may include an anchor to the substrate. Each electrode of the pluralities of first and second electrodes may include a suspended surface of the electrode parallel to a suspended surface of the resonator forming a transduction gap having a length that extends in a direction radiating from the anchor. The suspended surface of the electrode may be orthogonal to the plane of the substrate. Each electrode of the pluralities of first and second electrodes may include a plurality of suspended conductive finger structures interdigitated with suspended conductive fingers of the resonator. The suspended conductive fingers of the electrode and the resonator may form transduction gaps that extend circumferentially about the anchor. The resonator may include an aperture centered about the anchor. The plurality of first electrodes and the plurality of second electrodes may be disposed within the aperture, proximate to the resonator. The plurality of first electrodes may be disposed annularly around the anchor and the plurality of second electrodes may be disposed annularly around the anchor. The plurality of first electrodes and the plurality of second electrodes may be equidistant from the anchor.

In at least one embodiment of the invention, a method of operating a MEMS device includes driving a suspended resonator of the MEMS device to vibrate in a plane parallel to a substrate to which the resonator is anchored in response to an electrostatic force, the vibrations being rotational about an axis through the center of the resonator and orthogonal to the substrate. The method includes sensing rotational vibrations of the suspended resonator about the axis in response to the electrostatic force. The driving may vary a width of a transduction gap between a suspended surface of an electrode and a suspended surface of the resonator. The suspended surface of the electrode is orthogonal to the plane of the substrate. The transduction gap has a length that extends in a direction radiating from the axis. The driving may vary a capacitor area between suspended conductive finger structures interdigitated with suspended conductive fingers of the resonator. The suspended conductive fingers of the electrode and the resonator may form a transduction gap extending circumferentially about the axis. The vibrations may have a frequency that is approximately the resonant frequency of the MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
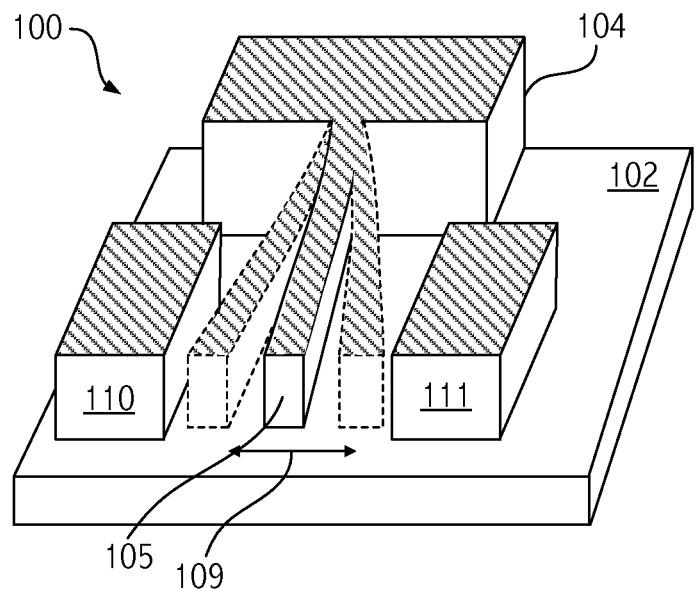
FIG. 1 illustrates a conventional MEMS device including an in-plane resonator.
Figure 2:
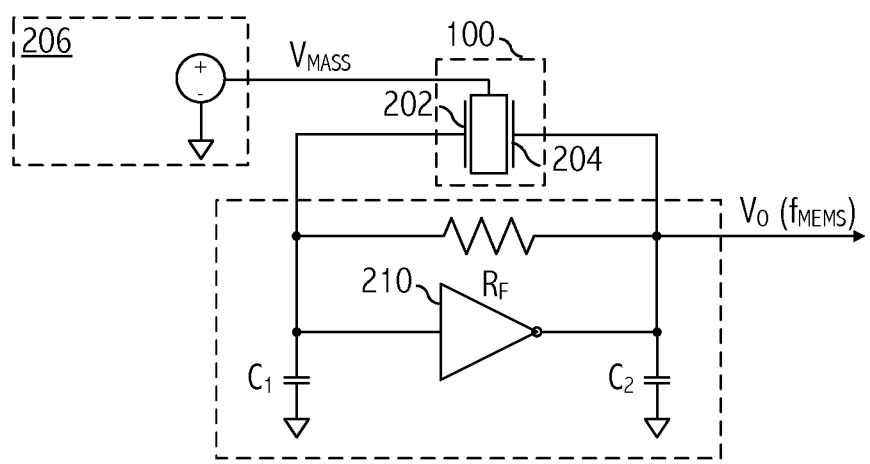
FIG. 2 illustrates a circuit diagram of a MEMS device configured as an oscillator.

Referring to FIG. 2, in an exemplary MEMS application, MEMS device 100 is coupled to amplifier 210 in an oscillator configuration. Sense electrode 202 provides a signal based on energy transfer from a vibrating resonator of MEMS device 100, thereby converting mechanical energy into an electrical signal. In general, bias signals introduced at various points of the circuit determine an operating point of the circuit and may be predetermined, fixed DC voltages or currents added to AC signals. The resonator of MEMS device 100 receives a DC bias voltage, $V_{RES}$, which is generated by a precision voltage reference or voltage regulator of bias generator 206. However, in other embodiments, bias signals may be introduced at the electrodes and/or other nodes of the oscillator circuit. A large feedback resistor ($R_F$) biases amplifier 210 in a linear region of operation, thereby causing amplifier 210 to operate as a high-gain inverting amplifier. The MEMS oscillator sustains vibrations of MEMS device 100 by feeding back the output of amplifier 210 to a drive electrode of MEMS device 100. Amplifier 210 receives a small-signal voltage from sense electrode 202 and generates a voltage on drive electrode 204 that causes the resonator of MEMS device 100 to continue to vibrate. MEMS device 100 in combination with capacitances $C_1$ and $C_2$ form a pi-network band-pass filter that provides 180 degrees of phase shift and a voltage gain from drive electrode 204 to sense electrode 202 at approximately the resonant frequency of MEMS device 100.

MEMS device 100 may be modeled as a spring-mass system having a resonant frequency, $$f_0 = \frac{1}{2\pi}\sqrt{\frac{k}{m}},$$

where k is a constant indicative of the spring stiffness, m is mass of the resonator, and $f_0$ is the resonant frequency. In general, the quality factor, Q, characterizes a resonator's bandwidth relative to its center frequency. The quality factor may be represented as $Q=2\pi f_0 m/\gamma$, where $\gamma$ is damping coefficient (e.g., due to fluid in cavity). A higher Q indicates a lower rate of energy loss relative to the stored energy of the resonator, i.e., oscillations die out more slowly. An oscillator with a higher Q resonates with higher amplitude but for a smaller range of frequencies around that frequency over smaller bandwidth. To achieve a high-precision, low-power resonator, a high mass may be desired so that the device can have a high stiffness. Increasing mass m increases the quality factor of the resonator. To maintain a particular resonant frequency, an increase in m requires a corresponding increase in k. Other design goals for a MEMS oscillator may include low-frequency operation (e.g., $f_0 < 1$ MHz) and insensitivity to shocks to the housing of the MEMS oscillator. A high stiffness reduces sensitivity to resonator voltage and reduces nonlinearities in operation. An in-plane resonator reduces interactions with housing and fluid (e.g., air) surrounding the resonator as compared to an out-of-plane resonator. Those interactions with the housing and fluid result in lower Q. In addition, preservation of spring stiffness while maximizing the moment of inertia helps to resist small variations in applied torque.

Figure 3A:
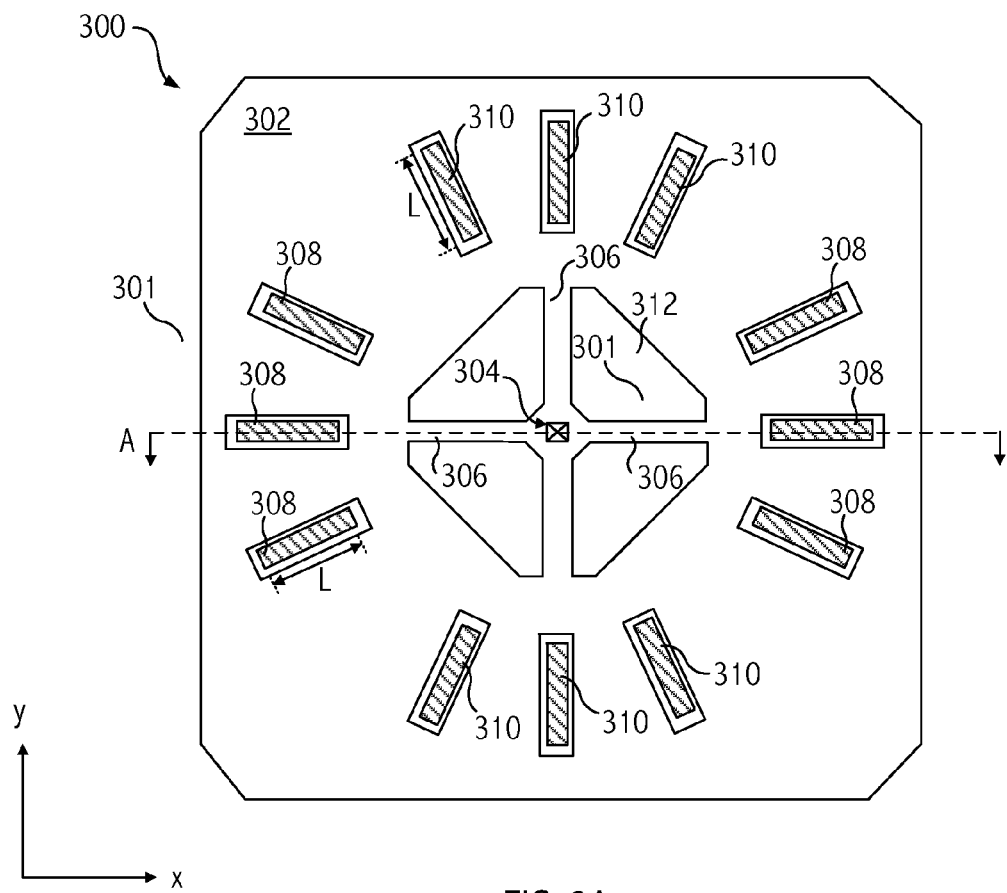
FIG. 3A illustrates an exemplary in-plane MEMS device with electrodes distributed within the resonator about an anchor of the resonator consistent with at least one embodiment of the invention.
Figure 3B:
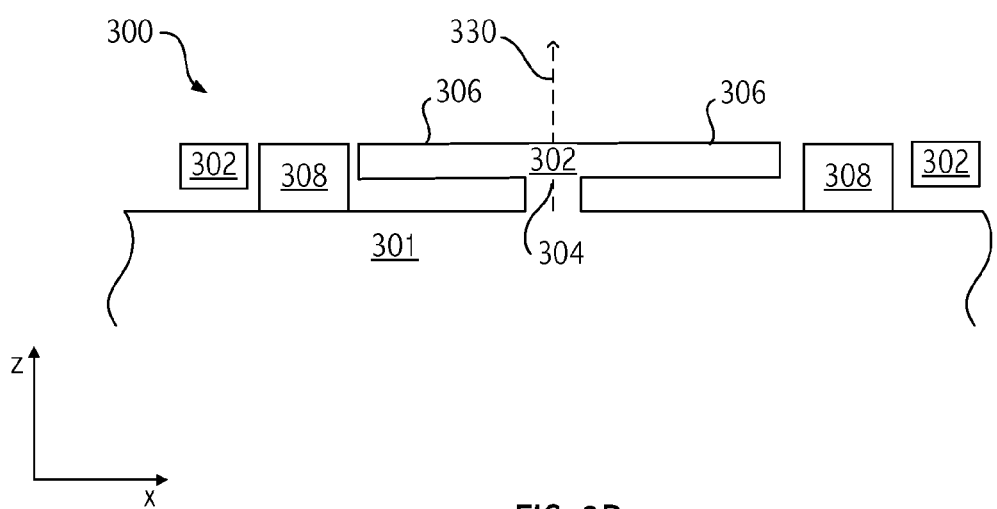
FIG. 3B illustrates a cross-sectional view of the MEMS device of FIG. 3A consistent with at least one embodiment of the invention.

Referring to FIGS. 3A and 3B, a MEMS device that achieves high-Q, low-power operation rotationally oscillates in a plane parallel to a plane of the substrate. MEMS device 300 includes resonator 302 that is suspended from substrate 301 and is anchored to substrate 301 at a center of resonator 302. Suspended beams 306 extend between anchor 304 and resonator 302 across a central aperture 312 in resonator 302. Resonator 302, suspended beams 306, and anchor 304 are formed from a conducting material (e.g., a silicon-germanium material). Suspended beams 306 behave like springs in a spring-mass system. The thickness and number of suspended beams 306 may vary and may be selected based on a target resonant frequency for MEMS device 300. The number of suspended beams may also be chosen based on a target ratio of an out-of-plane resonant frequency to an in-plane resonant frequency.

Resonator 302 includes multiple apertures in which electrodes 308 and electrodes 310 are formed. Electrodes 308 are configured as drive electrodes that form a capacitive transducer having surfaces orthogonal to the plane of the substrate and form a gap having a length (L) radiating away from the center of the resonator. Electrodes 310 are configured as sense electrodes that form a capacitive transducer having surfaces orthogonal to the plane of the substrate and form a gap having a length (L) radiating away from the center of the resonator. Electrodes 308 and 310 are distributed about anchor 304. Individual electrodes 308 and 310 are not centered within a corresponding aperture. When appropriate signals are applied to the electrodes 308 and electrodes 310, electrostatic attractions between resonator 302 and electrodes 308 and 310 cause clockwise and counter-clockwise torque on resonator 302 about axis 330. The geometry of electrodes 308 and 310 and the corresponding apertures of resonator 302 causes resonator 302 to rotationally vibrate about an axis through anchor 304 and orthogonal to substrate 301. Although electrodes 308 and 310 have the same geometry and are equidistant from anchor 304, other combinations of geometries and positioning may be used that result in a rotational motion of resonator 302 about axis 330.

The dimensions of resonator 302 may be determined to maximize an amount of mass, amount of energy stored for displacement, and/or spring stiffness of a MEMS device that can be manufactured in a predetermined area using a particular manufacturing process. Manufacturing design rules may also determine dimensions of resonator 302, e.g., conductive structures of resonator 302, which has a substantially square perimeter, have edges that form 45 degree angles. Thus, resonator 302 may have a rectangular, substantially rectangular, square, or substantially square outer perimeter. In addition, symmetry considerations may dictate the geometry of the resonator. In general, increasing resonator symmetry about an anchor reduces effects of strain and increases the quality factor of a MEMS resonator. The anchor may be positioned at a vibration nodal point of the resonator to reduce energy losses to the substrate and increase the quality factor. To increase the symmetry of resonator 300 about the anchor, rather than use a rectangular perimeter, resonator 302 is substantially square, although octagonal, hexagonal, or circular geometries, may be used. Manufacturing techniques that may be used to produce the MEMS devices of FIGS. 3A and 3B and FIGS. 4-7 are described in U.S. Pat. No. 7,514,760, filed Mar. 9, 2007, entitled "IC-Compatible MEMS Structure," naming Emmanuel P. Quevy as inventor; U.S. patent application Ser. No. 13/075,800, filed Mar. 30, 2011, entitled "Technique for Forming a MEMS Device," naming Emmanuel P. Quevy et al., as inventors; and U.S. patent application Ser. No. 13/075,806, filed Mar. 30, 2011, entitled "Technique for Forming a MEMS Device Using Island Structures," naming Emmanuel P. Quevy et al., as inventors, which applications are incorporated herein by reference.

Referring back to FIG. 3A, although electrodes 308 and 310 and the corresponding apertures in resonator 302 are illustrated as having rectangular geometries, those geometries may vary. For example, the electrodes may include one or more teeth-like structures and the resonator may include corresponding notches on the perimeter of the apertures that increase the area of the transduction gap of the resulting parallel plate transducers. Note that although four suspended beams 306 are illustrated, other numbers of beams may be used. The number and geometry of the suspended beams may be design choices that vary the spring stiffness of MEMS device 300 and determine the resonant frequency. Since resonator 302 displaces in rotational directions (i.e., clockwise and counterclockwise about axis 330) rather than displacing in a lateral direction (e.g., x-direction or y-direction), MEMS device 300 is increasingly resistant to linear shock or acceleration and the outer perimeter of resonator 302 has reduced interactions with the residual atmosphere surrounding the resonator.

Figure 4:
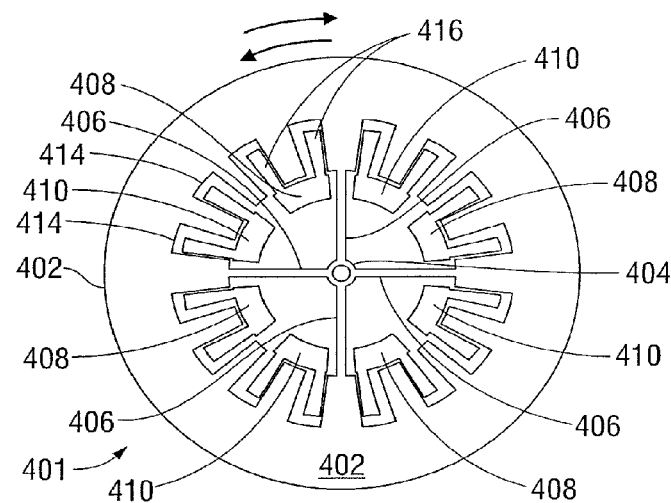
FIG. 4 illustrates an exemplary in-plane MEMS device with electrodes distributed at an inner perimeter of the resonator about an anchor of the resonator consistent with at least one embodiment of the invention.
Figure 5:
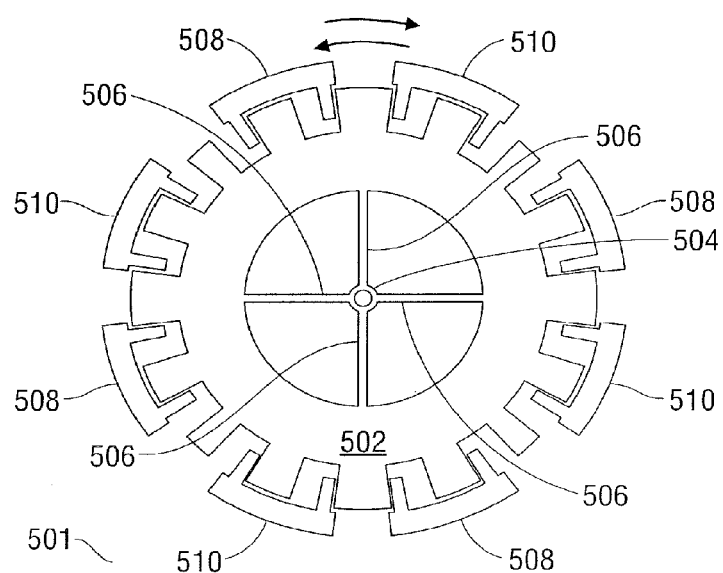
FIG. 5 illustrates an exemplary in-plane MEMS device with electrodes distributed at an outer perimeter of the resonator about an anchor of the resonator consistent with at least one embodiment of the invention.
Figure 6:
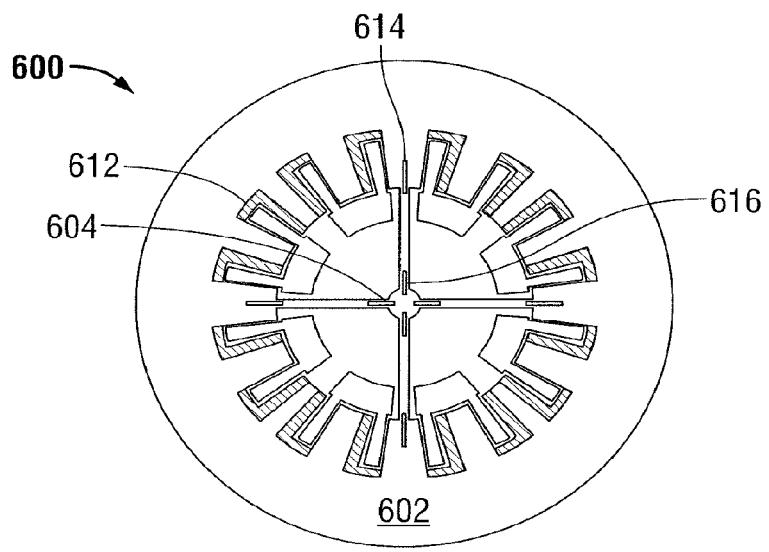
FIG. 6 illustrates an exemplary in-plane MEMS device with electrodes distributed at an inner perimeter of the resonator about an anchor of the resonator and including spacer portions and portions having different coefficients of thermal expansion consistent with at least one embodiment of the invention.

Rather than locating the electrodes within multiple apertures distributed throughout the resonator, as illustrated in FIG. 3A, the electrodes may be located at an inner perimeter of a central aperture of the resonator, as illustrated by electrodes 408 and 410 in FIG. 4, or on an outer perimeter of the resonator, as illustrated by electrodes 508 and 510 in FIG. 5. However, if the electrodes are located closer to the anchor (e.g., FIG. 4), the motional resistance of the MEMS device increases and less displacement is needed at the electrodes to generate a signal of the same amplitude as a MEMS device with electrodes located farther from the resonator anchor.

In general, materials (e.g., silicon-germanium materials) used to manufacture the resonator of the MEMS device may statically deflect out-of-plane (i.e., away from the substrate) after being released from sacrificial manufacturing layers formed on the substrate. This static deflection typically increases with increased distance from the resonator anchor and can change the capacitive transduction of the MEMS device. One technique for reducing or eliminating effects of the static deflection of the resonator away from the substrate includes positioning the electrodes closer to the anchor, e.g., in a central aperture of the resonator, proximate to an inner perimeter of the resonator. Referring to FIGS. 3 and 4, locating the electrodes away from the outer perimeter of resonator 302 and closer to anchor 304 reduces the effects of static deflection of the material that forms resonator 302.

Although typical silicon manufacturing processes require right angles or 45 degree angles, some MEMS manufacturing processes allow other geometries, e.g., circular geometries. Referring back to FIG. 4, MEMS device 400 includes a resonator having an annular shape. Annular resonator 402 is suspended from substrate 401. Suspended beams 406 extend across a central aperture between resonator 402 and anchor 404, which fixes the beams and resonator to substrate 401. Resonator 402 includes notches 414 that form a gap between the resonator and electrodes 408 and 410. Electrodes 408 and 410 include suspended teeth portions 416 that are anchored to substrate 401 by electrode portions formed on the circumference of the inner perimeter of resonator 402. Suspended portions of electrodes 408 and 410 may have the same height and are suspended at the same distance above substrate 401 as resonator 402.

In at least some embodiments, a MEMS device may include additional design features. For example, referring to FIG. 6, a technique for increasing the distance between conductive portions of the resonator and an electrode, but still satisfying manufacturing design rule constraints, includes forming spacer portions 612 of resonator 602 from an insulating material that adheres to the sidewalls of resonator 602. The spacer portions may be formed by typical microelectronic manufacturing techniques (e.g., deposition, lithography, etc.) of an insulating material (e.g., oxide) and may have any geometry consistent with manufacturing design rules, the geometry of the electrodes, and a target distance between those electrodes.

In at least some embodiments, a MEMS device may include temperature compensation structures that may be formed as insets in the electrodes, resonator, anchor, and/or beams. For example, temperature compensation insets 614 of material (e.g., a material selected from the group consisting of silicon dioxide, silicon nitride, silicon oxy-nitride and a high-k dielectric material) having a coefficient of thermal expansion different from the coefficient of thermal expansion for the surrounding material are disposed at the joint between the suspended beams and mass 602. The material having the different coefficient of thermal expansion creates a stress in response to a change in temperature that reduces effects of stress on the surrounding material in response to the temperature change. Temperature compensation insets 616 are disposed at the joint between the suspended beams and anchor 604. Those temperature compensation structures may have any geometry consistent with manufacturing design rules, the geometry of the surrounding conducting material, and a target amount of temperature compensation. Similarly, the MEMS device (e.g., the resonator and/or electrodes) may include structures formed from materials (e.g., oxide) having a lower stress gradient across thickness than surrounding material (e.g., silicon-germanium materials). Those structures may be formed as insets in the electrodes or resonator to reduce or eliminate out-of-plane mismatch of the resonator and electrodes after being released from sacrificial manufacturing layers formed on the substrate. Those structures may have any geometry consistent with manufacturing design rules, the geometry of the surrounding conducting material, and a target amount of temperature compensation.

Figure 7:
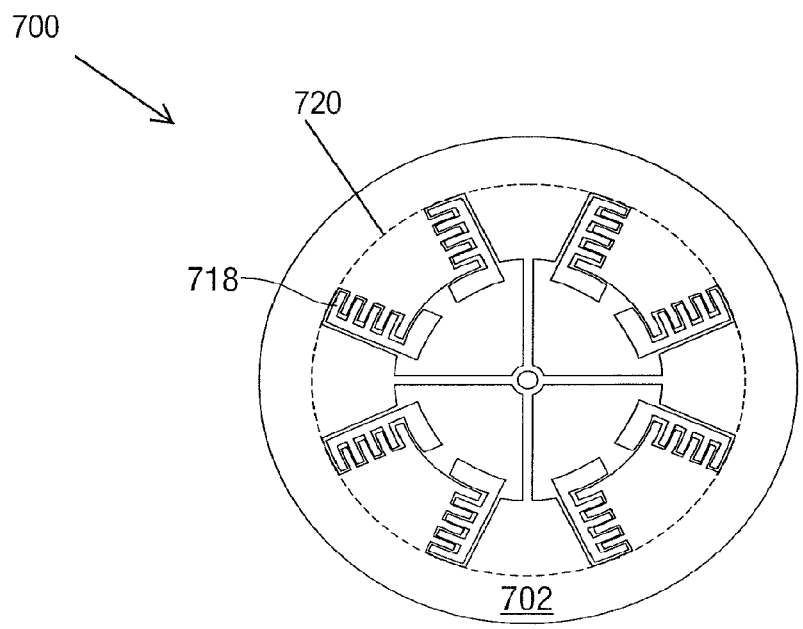
FIG. 7 illustrates an exemplary in-plane MEMS device with comb drive electrodes distributed at an inner perimeter of the resonator about an anchor of the resonator consistent with at least one embodiment of the invention.

In at least some embodiments, a MEMS device may include different transducer techniques that cause the MEMS resonator to rotationally resonate about the central axis orthogonal to the plane of the substrate. Referring to FIG. 7, in at least one embodiment of a MEMS device, rather than using parallel plate transducers, MEMS device 700 includes resonator 702 and multiple corresponding suspended electrodes that form comb drive transducers. Resonator 702 includes multiple conductive finger structures distributed radially about the anchor and interdigitated with corresponding conductive fingers of multiple electrodes distributed radially about the anchor. The interdigitated finger structures of resonator 702 and finger structures of corresponding electrodes form circumferential gaps between the finger structures that extend circumferentially about a corresponding circle (e.g., circle 720) centered about the anchor. Those interdigitated fingers move circumferentially (i.e., along a perimeter centered about the axis) keeping the transduction gap constant but changing the capacitor area so that the capacitance changes linearly with displacement. In operation, the electrostatic force generated by those structures causes resonator 702 to rotationally resonate about an axis orthogonal to the plane of the substrate.

Thus, techniques for generating a MEMS device that achieves a high Q for low resonant frequencies in a predetermined area and that rotationally oscillates in a plane parallel to a plane of the substrate have been described. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. Structures described herein may be implemented using software executing on a processor (which includes firmware) or by a combination of software and hardware. Software, as described herein, may be encoded in at least one tangible computer readable medium. As referred to herein, a tangible computer-readable medium includes at least a disk, tape, or other magnetic, optical, or electronic storage medium.

The description of the invention set forth herein is illustrative, and is not intended to limit the scope of the invention as set forth in the following claims. For example, while the invention has been described in embodiments in which a MEMS device has a particular number of electrodes and suspended beams, one of skill in the art will appreciate that the teachings herein can be utilized with other types of MEMS devices, e.g., MEMS devices having any number of electrodes and suspended beams that achieve target resonator specifications for a particular application (e.g., area, resonant frequency, and quality factor). Although the MEMS devices have been described with respect to oscillator applications, techniques described herein may be adapted to other MEMS applications (e.g., filter or sensor applications). Variations and modifications of the embodiments disclosed herein, may be made based on the description set forth herein, without departing from the scope and spirit of the invention as set forth in the following claims.

What is claimed is:

1. An apparatus comprising:
   a microelectromechanical system (MEMS) device comprising:
   a resonator suspended from a substrate;
   an anchor disposed at a center of the resonator;
   a plurality of suspended beams radiating between the anchor and the resonator;
   a plurality of first electrodes disposed about the anchor, the plurality of first electrodes and the resonator forming a first electrostatic transducer; and
   a plurality of second electrodes disposed about the anchor, the plurality of second electrodes and the resonator forming a second electrostatic transducer,
   wherein the first electrostatic transducer and the second electrostatic transducer are configured to sustain rotational vibrations of the resonator at a predetermined frequency about an axis through the center of the resonator and orthogonal to a plane of the substrate in response to a signal on the plurality of first electrodes,
   wherein each electrode of the pluralities of first and second electrodes comprises an electrode anchor to the substrate and a suspended surface parallel to a suspended surface of the resonator forming a transduction gap having a length that extends in a direction radiating from the anchor, the suspended surface of the electrode being orthogonal to the plane of the substrate.

2. The apparatus, as recited in claim 1, wherein each of the plurality of first electrodes and the plurality of second electrodes comprises first and second portions having different coefficients of thermal expansion.

3. The apparatus, as recited in claim 1, wherein the MEMS device includes a material having a lower stress gradient across a thickness than other material of the MEMS device.

4. The apparatus, as recited in claim 1, wherein the resonator comprises an aperture centered about the anchor and the plurality of first electrodes and the plurality of second electrodes are disposed within the aperture, proximate to the resonator.

5. The apparatus, as recited in claim 1, wherein the plurality of first electrodes are disposed annularly about the anchor and the plurality of second electrodes are disposed annularly about the anchor, the plurality of first electrodes and the plurality of second electrodes being equidistant from the anchor.

6. The apparatus, as recited in claim 1, wherein the first and second transducers comprise parallel plate capacitors or comb structures.

7. The apparatus, as recited in claim 1, wherein the MEMS device is configured as part of an oscillator circuit, the apparatus further comprising:
   an amplifier coupled between the first transducer and the second transducer;
   a resistor coupled between the first transducer and the second transducer; and
   a capacitor coupled to the first transducer or the second transducer.

8. The apparatus, as recited in claim 1, wherein the plurality of first electrodes and the plurality of second electrodes are equally distributed about the anchor in alternating positions.

9. The apparatus, as recited in claim 1, wherein the resonator is annular.

10. The apparatus, as recited in claim 1, wherein the anchor and plurality of suspended beams each comprise first and second portions having different coefficients of thermal expansion.

11. A method of operating a microelectromechanical system (MEMS) device comprising:
   driving a suspended resonator of the MEMS device to vibrate in a plane parallel to a substrate to which the resonator is anchored in response to an electrostatic force, the vibrations being rotational about an axis through the center of the resonator and orthogonal to the substrate; and sensing rotational vibrations of the suspended resonator about the axis in response to the electrostatic force, wherein the driving varies a width of a transduction gap between a suspended surface of an electrode and a suspended surface of the resonator, the suspended surface of the electrode being orthogonal to the plane of the substrate, the transduction gap having a length that extends in a direction radiating from the axis.

12. The method, as recited in claim 11, wherein the vibrations have a frequency that is approximately the resonant frequency of the MEMS device.

13. An apparatus comprising:
a microelectromechanical system (MEMS) device comprising:
   a resonator suspended from a substrate;
   an anchor disposed at a center of the resonator;
   a plurality of suspended beams radiating between the anchor and the resonator;
   a plurality of first electrodes disposed about the anchor, the plurality of first electrodes and the resonator forming a first electrostatic transducer; and
   a plurality of second electrodes disposed about the anchor, the plurality of second electrodes and the resonator forming a second electrostatic transducer,
wherein the first electrostatic transducer and the second electrostatic transducer are configured to sustain rotational vibrations of the resonator at a predetermined frequency about an axis through the center of the resonator and orthogonal to a plane of the substrate in response to a signal on the plurality of first electrodes, wherein the resonator comprises insulating portions to increase an effective distance between conductive portions of the resonator and the pluralities of first and second electrodes.

14. The apparatus, as recited in claim 13, wherein each electrode of the pluralities of first and second electrodes comprises an electrode anchor to the substrate and a suspended surface parallel to a suspended surface of the resonator forming a transduction gap having a length that extends in a direction radiating from the anchor, the suspended surface of each electrode of the pluralities of first and second electrodes being orthogonal to the plane of the substrate.

15. The apparatus, as recited in claim 13, wherein each electrode of the pluralities of first and second electrodes comprises an electrode anchor to the substrate and a plurality of suspended conductive finger structures interdigitated with suspended conductive fingers of the resonator, the suspended conductive fingers of each electrode of the pluralities of first and second electrodes and the resonator forming transduction gaps that extend circumferentially about the anchor.

16. The apparatus, as recited in claim 13, wherein the resonator comprises a plurality of apertures equidistant from the anchor and each of the plurality of first electrodes and the plurality of second electrodes is disposed within a corresponding aperture of the plurality of apertures.

17. The apparatus, as recited in claim 13, wherein the plurality of first electrodes and the plurality of second electrodes are disposed proximate to the resonator outside the perimeter of the resonator.

* * * * *